(12) United States Patent
Bae et al.

(10) Patent No.: US 9,588,415 B2
(45) Date of Patent: Mar. 7, 2017

(54) ELECTRON BEAM EXPOSURE SYSTEM AND METHODS OF PERFORMING EXPOSING AND PATTERNING PROCESSES USING THE SAME

(71) Applicant: Samsung Electronics Co., Ltd., Suwon-si (KR)

(72) Inventors: Sukjong Bae, Seoul (KR); Jin Choi, Yongin-si (KR); Sunghoon Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 65 days.

(21) Appl. No.: 14/590,145

(22) Filed: Jan. 6, 2015

(65) Prior Publication Data

US 2015/0355547 A1 Dec. 10, 2015

(30) Foreign Application Priority Data

Jun. 5, 2014 (KR) .......................... 10-2014-0068531

(51) Int. Cl.
*G03F 1/56* (2012.01)
*G03F 1/70* (2012.01)
*G03F 7/20* (2006.01)

(52) U.S. Cl.
CPC .................. *G03F 1/56* (2013.01); *G03F 1/70* (2013.01); *G03F 7/2063* (2013.01)

(58) Field of Classification Search
CPC ........ H01J 37/28; H01J 37/3045; H01J 37/05; H01J 37/265; H01J 37/304; H01J 37/045; H01J 37/10; H01J 37/21; H01J 37/3056; G01N 23/225; G01N 23/00; G01N 23/22

USPC ...... 250/492.22, 492.3, 492.2, 396 R, 492.1, 250/491.1, 252.1, 492.23, 396 ML, 250/453.11; 430/296, 942, 494

See application file for complete search history.

(56) References Cited

U.S. PATENT DOCUMENTS

| | | | |
|---|---|---|---|
| 5,424,548 A | 6/1995 | Puisto | |
| 7,076,761 B2 * | 7/2006 | Inanami | B82Y 10/00 716/55 |
| 7,456,414 B2 | 11/2008 | Mirro, Jr. et al. | |
| 7,786,453 B2 | 8/2010 | Sakamoto et al. | |
| 7,807,988 B2 | 10/2010 | Usa et al. | |
| 8,129,698 B2 | 3/2012 | Nakayamada et al. | |
| 8,187,778 B2 | 5/2012 | Choi et al. | |
| 8,257,888 B2 | 9/2012 | Sczyrba et al. | |
| 8,461,555 B2 | 6/2013 | Kurohori | |
| 2012/0286174 A1 | 11/2012 | Gomi et al. | |
| 2013/0032707 A1 | 2/2013 | Nakayamada et al. | |
| 2013/0256519 A1 | 10/2013 | Kato et al. | |

FOREIGN PATENT DOCUMENTS

| | | |
|---|---|---|
| JP | 2001035769 | 2/2001 |
| JP | 2012069661 | 4/2012 |
| KR | 100576818 | 5/2006 |

* cited by examiner

*Primary Examiner* — David A Vanore
(74) *Attorney, Agent, or Firm* — Onello & Mello LLP

(57) ABSTRACT

An exposure system includes a data processing part that forms an exposure layout and an exposure part that irradiates an electron beam at a photoresist layer according to the exposure layout. The data processing part generates a control parameter for driving the exposure part without a pattern position error and a beam drift error and to prevent a discrepancy between the exposure layout and a mask layout to be formed in the photoresist layer. A controlling part controls the exposure part according to the control parameter.

17 Claims, 9 Drawing Sheets

ELECTRON BEAM EXPOSURE SYSTEM AND METHODS OF PERFORMING EXPOSING AND PATTERNING PROCESSES USING THE SAME

CROSS-REFERENCE TO RELATED APPLICATIONS

This United States non-provisional patent application claims priority under 35 U.S.C. §119 to Korean Patent Application No. 10-2014-0068531, filed on Jun. 5, 2014, in the Korean Intellectual Property Office, the entire contents of which are hereby incorporated by reference.

BACKGROUND

Example embodiments of the inventive concept relate to a patterning technology for forming fine patterns, and in particular, to an electron beam exposure system and methods of performing exposing and patterning processes using the same.

Conventional lithography technologies allow for an improvement in an integration density and productivity of electronic devices. In particular, a photolithography process is performed to transfer mask patterns formed on a photomask onto a photoresist layer on a substrate. Accuracy in position of the mask patterns is a very important factor in determining the quality of the resulting products. The photomask is generally fabricated by an exposure system that applies an electron beam (e-beam). The conventional e-beam exposure system may result in pattern position and beam drift errors, depending on the distribution of patterns in an exposure layout.

SUMMARY

Example embodiments of the inventive concept provide an electron beam exposure system configured to reduce a pattern position error and methods of performing exposing and patterning processes using the same.

Other example embodiments of the inventive concept provide an electron beam exposure system configured to reduce a beam drift error and methods of performing exposing and patterning processes using the same.

According to example embodiments of the inventive concept, an exposure system may include a data processing part that forms an exposure layout; and an exposure part that irradiates an electron beam at a photoresist layer according to the exposure layout. The data processing part is constructed and arranged to generate a control parameter for driving the exposure part without a pattern position error and a beam drift error and to prevent a discrepancy between the exposure layout and a mask layout to be formed in the photoresist layer. The exposure system further includes a controlling part that controls the exposure part according to the control parameter.

In example embodiments, the data processing part may derive the control parameter from a shot density, wherein the shot density includes an area occupied by the layout patterns per a unit area of the exposure layout.

In example embodiments, the data processing part may calculate a characterizing parameter associated with the shot density and derive the control parameter from the characterizing parameter.

In example embodiments, the shot density may include a first density for a dense region in the exposure layout, and a second density for a sparse region other than the dense region. The data processing part may calculate the characterizing parameter from a difference or ratio between the first and second densities.

In example embodiments, the exposure part may include a beam source that generates the electron beam; a deflector that deflects the electron beam in a tilted direction relative to the mask layer; a stage that supports the substrate and moves the substrate relative to the electron beam. The control parameter may comprise a first control parameter associated with an acceleration of the stage; and a second control parameter associated with a deflection width of the electron beam in the deflector.

In example embodiments, the stage may be accelerated at an interface between the dense and sparse regions of the exposure layout such that a velocity of the stage is lower at the dense region than at the sparse region, and the first control parameter may be correlated with the acceleration of the stage in a scanning direction of the electron beam.

In example embodiments, the second control parameter may be correlated with the deflection width of the electron beam in the dense and sparse regions adjacent to each other in a direction perpendicular to the scanning direction of the electron beam.

In example embodiments, the exposure layout may include a main pattern region at the dense region, and a scribe lane region at the sparse region to surround the main pattern region. The scribe lane region may include a first scribe lane region parallel to the scanning direction of the electron beam and adjacent to the main pattern region, and a second scribe lane region perpendicular to the scanning direction of the electron beam. The controlling part controls the exposure part using the first control parameter to prevent the pattern position error near an interface between the first scribe lane region and the main pattern region and controls the exposure part using the second control parameter to prevent the beam drift error near an interface between the second scribe lane region and the main pattern region.

In example embodiments, the data processing part calculates a shot density, wherein the shot density includes an area occupied by the layout patterns per a unit area of the exposure layout, from a characterizing parameter, and the data processing part further derives the first control parameter from a proportional constant between the characterizing parameter and the acceleration of the stage, and derives the second control parameter from a correlation value between the characterizing parameter, a contamination level of the deflector, and the deflection width of the electron beam.

In example embodiments, the exposure system may further include a database including a lookup table. The proportional constant and the correlation value are stored at the lookup table.

According to example embodiments of the inventive concept, an exposing method may include preparing an exposure layout; generating a control parameter of an exposure part obtained from the exposure layout; and exposing a photoresist layer with an electron beam emitted from the exposure part to form mask patterns based on the exposure layout, wherein the control parameter is generated for driving the exposure part without a pattern position error and a beam drift error and to reduce a discrepancy between the exposure layout and a mask layout to be formed in the photoresist layer.

In example embodiments, the deriving of the control parameter may include calculating a characterizing parameter from a shot density, wherein the shot density includes an area occupied by layout patterns per a unit area of the exposure layout; and deriving the control parameter from the characterizing parameter.

In example embodiments, the calculating of the characterizing parameter may include calculating the shot density of the exposure layout, and calculating the characterizing parameter from the shot density.

In example embodiments, the calculating of the characterizing parameter may include obtaining shot densities in dense and sparse regions, respectively, which include two distinct regions of the exposure layout; and comparing the shot densities in the dense and sparse regions to calculate the characterizing parameter.

In example embodiments, the shot density may include a first density for the dense region, and a second density for the sparse region. The characterizing parameter may be calculated based on a difference or ratio between the first and second densities.

According to example embodiments of the inventive concept, an exposure system may comprise a data processing part that forms an exposure layout and generates a control parameter from the exposure layout; an exposure part that irradiates an electron beam at a photoresist layer according to the exposure layout; and a controlling part that controls the exposure part according to the control parameter.

In example embodiments, the data processing part may generate the control parameter for driving the exposure part without a pattern position error and a beam drift error and prevent a discrepancy between the exposure layout and a mask layout to be formed in the photoresist layer.

In example embodiments, the data processing part may derive the control parameter from a shot density, calculate a characterizing parameter associated with the shot density, and derive the control parameter from the characterizing parameter.

In example embodiments, the characterizing parameter may be calculated by obtaining shot densities in dense and sparse regions, respectively, which include two distinct regions of the exposure layout; and comparing the shot densities in the dense and sparse regions to calculate the characterizing parameter.

In example embodiments, the exposure part may comprise; a beam source that generates the electron beam; a deflector that deflects the electron beam in a tilted direction relative to the mask layer; and a stage that supports the substrate and moves the substrate relative to the electron beam. The control parameter may comprise a first control parameter associated with an acceleration of the stage; and a second control parameter associated with a deflection width of the electron beam in the deflector.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
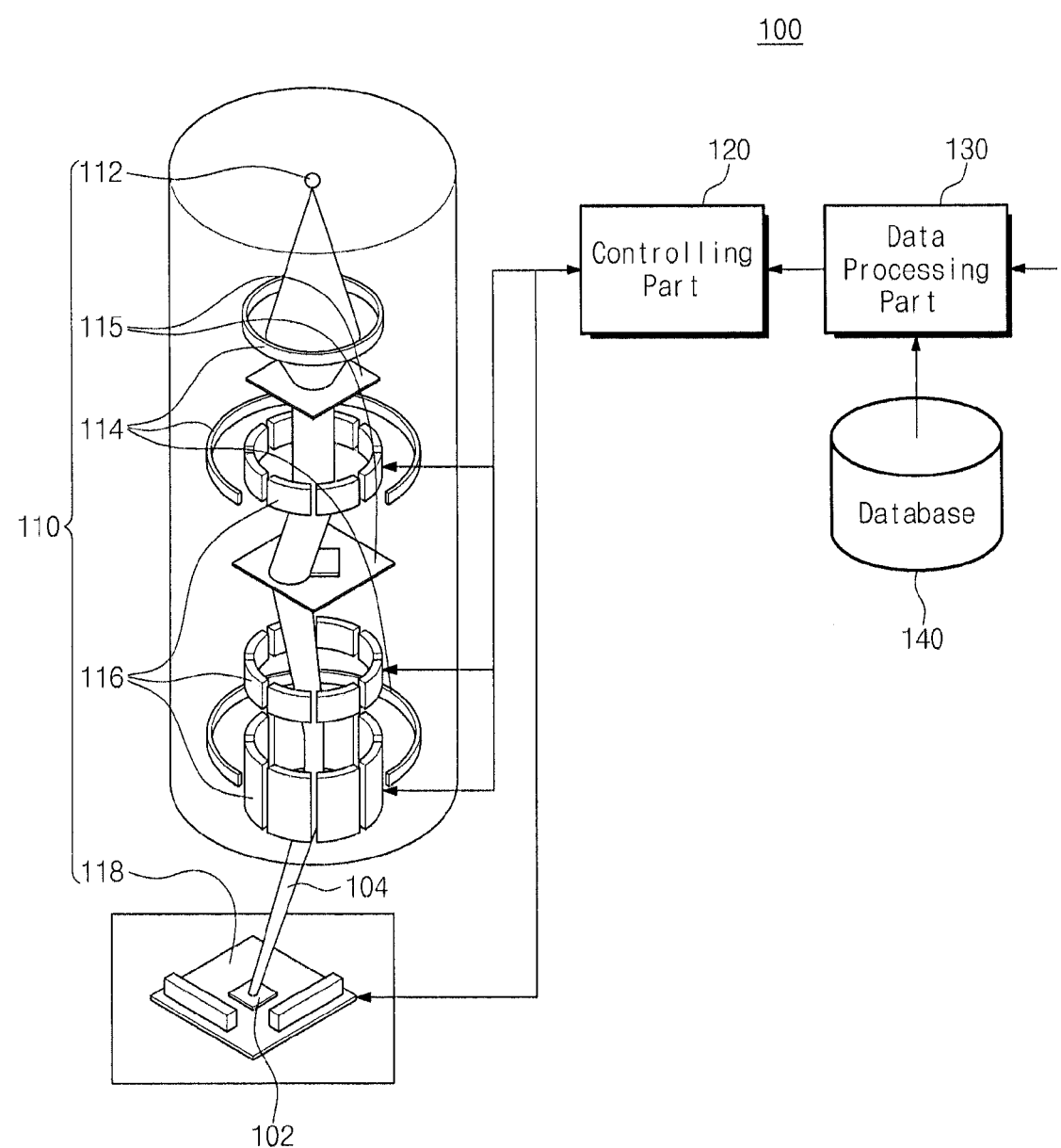
FIG. 1 is a schematic diagram illustrating an exposure system according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic diagram illustrating an exposure system 100 according to example embodiments of the inventive concept. The exposure system 100 may include an exposure part 110, a controlling part 120, a data processing part 130, and a database 140.

The exposure part 110 may be configured to provide an electron beam 104 onto a substrate 102. In certain embodiments, in place of the electron beam 104, an ion beam or the like may be generated by the exposure system 100. The exposure part 110 may include a beam source 112, lenses 114, apertures 115, deflectors 116, and a stage 118. The beam source 112 may be configured to produce the electron beam 104 directed at the stage 118. The lenses 114 may be configured to focus the electron beam 104 onto a specific region of the substrate 102 positioned at the stage 118. The exposure part 110 may be configured in such a way that the electron beam 104 is normally incident onto a top surface of the substrate 102. The apertures 115 may control an intensity or other feature of the electron beam 104. The lenses 114, the apertures 115, and the deflectors 116 may be disposed between the beam source 112 and the stage 118 (for example, in an alternative manner).

Figure 2:
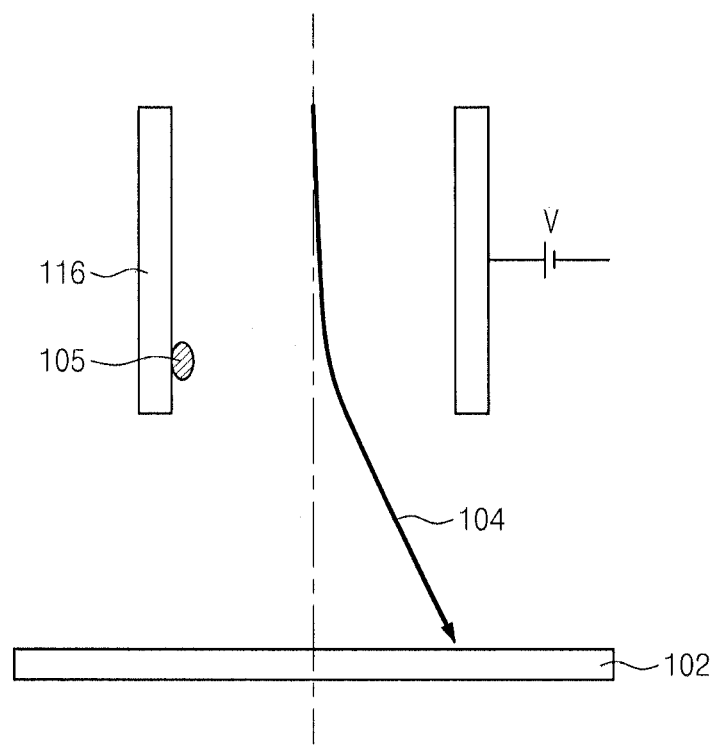
FIG. 2 is a diagram illustrating a method of deflecting an electron beam of FIG. 1.

FIG. 2 is a diagram illustrating a method of deflecting the electron beam 104 of FIG. 1. The deflectors 116 may be configured to deflect the electron beam 104 passing therethrough. The deflected electron beam 104 may be incident onto the substrate 102 at an angle relative to the top surface of the substrate 102. In example embodiments, the deflectors 116 may be configured to apply an electric field to the electron beam 104. The extent of the deflection of the electron beam 104 may be proportional to the electric field. The controlling part 120 (see FIG. 1) may supply an electric current or power required for generating the electric field to the deflectors 116. The extent of the deflection of the electron beam 104 may be controlled by the controlling part 120 by adjusting an amount of the electric current.

Referring back to FIG. 1, the stage 118 may support the substrate 102. The substrate 102 may be exposed for scanning by the electron beam 104. For this, the stage 118 may be configured to move the substrate 102 to be in a line of sight of the electron beam 104. A propagation path of the electron beam 104 may be fixed, and the substrate 102 may be moved relative to the electron beam 104. The stage 118 may be horizontally moved in such a way that the entire top surface of the substrate 102 is scanned by the electron beam 104. The stage 118 may be configured to move the substrate 102 at a constant velocity. In certain embodiments, the stage 118 may be configured to accelerate the substrate 102. The velocity or acceleration of the stage 118 or the substrate 102 may be controlled by adjusting an electric power supplied thereto. For example, the velocity or acceleration of the stage 118 or the substrate 102 may be proportional to the electric power supplied thereto. The controlling part 120 may control the amount of electric power supplied to the stage 118 which can be moved, and thereby moving the substrate 102 at a predetermined velocity and/or acceleration.

In doing so, the controlling part 120 may control the exposure part 110. For example, the controlling part 120 may be configured to control velocity, acceleration, and movement mode of the stage 118. The controlling part 120 may also be configured to control the deflection extent (or width) of the electron beam 104.

The data processing part 130 may provide scanning information, which is required for scanning the substrate 102 with the electron beam 104, to the controlling part 120. The controlling part 120 and the data processing part 130 may be part of a single processing unit. However, example embodiments of the inventive concepts may not be limited thereto.

Figure 3:
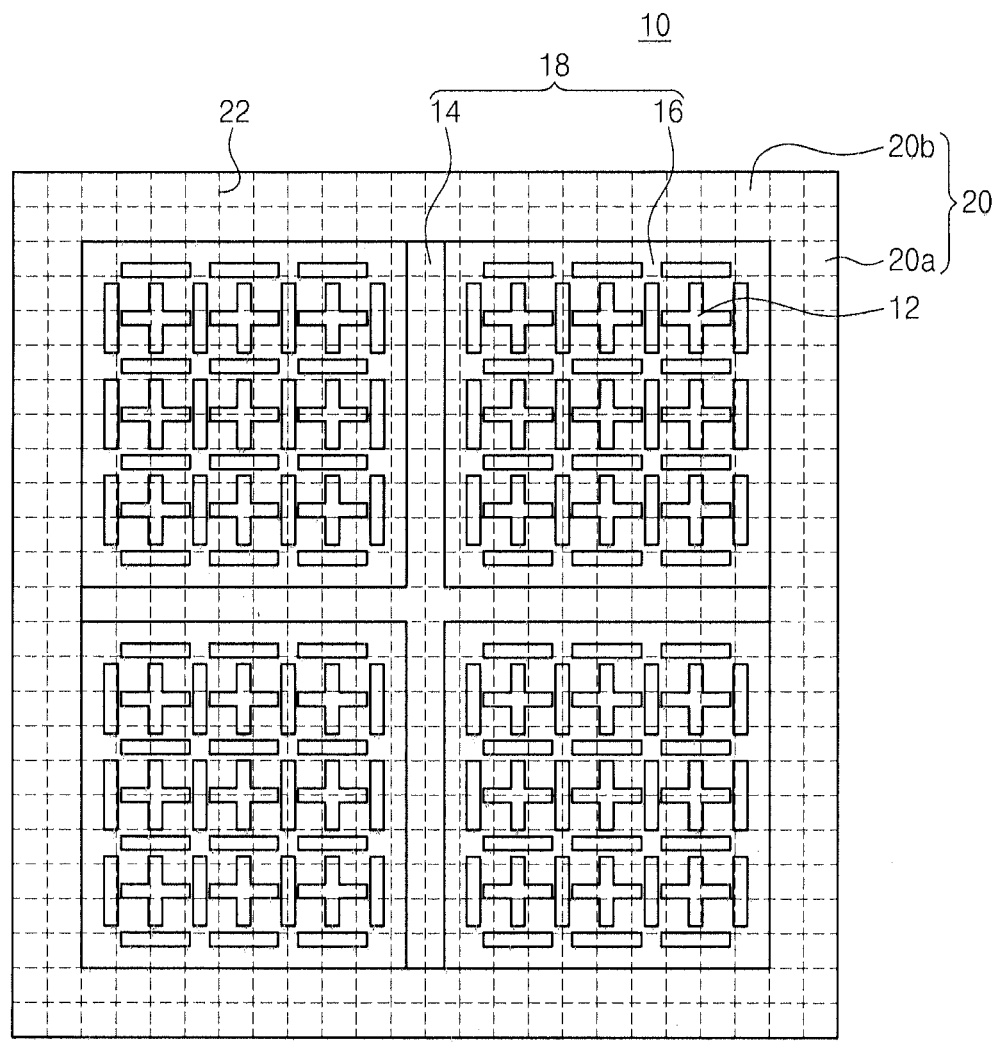
FIG. 3 is a plan view illustrating an example of an exposure layout according to example embodiments of the inventive concept.

FIG. 3 is a plan view illustrating an example of an exposure layout 10, which may be produced by the exposure system 100 of FIG. 1, more specifically, formed by the data processing part 130. The exposure layout 10 may be based on a design layout, described below, and produced to reduce pattern position and beam drift errors with respect to the exposure system 100, and thereby prevent a discrepancy or related disagreement between a mask layout and the exposure layout. The design layout may be provided from the database 140 to the data processing part 130. In some embodiments, the exposure layout 10 includes a main pattern region 18 and a scribe lane region 20. The main pattern region 18 may be a dense region in which layout patterns 12 are closely provided. The main pattern region 18 may include cell regions 16 and a peripheral circuit region 14. The layout patterns 12 may be arranged having a high density at the cell regions 16 and with a relatively low density at the peripheral circuit region 14. For example, the peripheral circuit region 14 may be disposed between the cell regions 16, and a density of the layout patterns 12 may be smaller in the peripheral circuit region 14 than in the cell regions 16. In embodiments where the exposure layout 10 is used for a memory device with four banks, the exposure layout 10 may be configured to have four cell regions and a cross-shaped peripheral circuit region.

The scribe lane region 20 may be provided around the main pattern region 18. The scribe lane region 20 may be a sparse region having a zero or low density of the layout pattern 12. The scribe lane region 20 may include a first scribe lane region 20a, which is located adjacent to the main pattern region 18 in a scanning direction of the electron beam 104, and a second scribe lane region 20b, which is located adjacent to the main pattern region 18 in a direction perpendicular to the scanning direction of the electron beam 104. As an example, the scanning direction of the electron beam 104 may be configured to be parallel to a horizontal direction of FIG. 3, In forming the exposure layout 10, the data processing part 130 may be configured to calculate or otherwise obtain a shot density of the exposure layout 10, The shot density may be defined as an area occupied by the layout patterns 12 per a unit area 22 of the exposure layout 10. In example embodiments, the unit area 22 (shown in FIG. 3 by a square defined by dotted lines) may range from several hundreds of square nanometers to several square micrometers. A shot density in the main pattern region 18 may be different from that in the scribe lane region 20. Further, a shot density in the cell regions 16 may be different from that in the peripheral circuit region 14. For example, the main pattern region 18 and the scribe lane region 20 may be configured to have first and second densities, respectively, where the first density is greater than the second density. The first density may be a mean shot density of the main pattern region 18, and the second density may be a mean shot density of the scribe lane region 200. In other words, the main pattern region 18 may have a shot density that is higher than that of the scribe lane region 20, but is not limited thereto.

The data processing part 130 may be configured to calculate a pattern-layout-characterizing parameter from the shot density. For example, the pattern-layout-characterizing parameter may be calculated a difference between first and second densities. Alternatively, the pattern-layout-characterizing parameter may be calculated from a ratio between the first and second densities.

Figure 4:
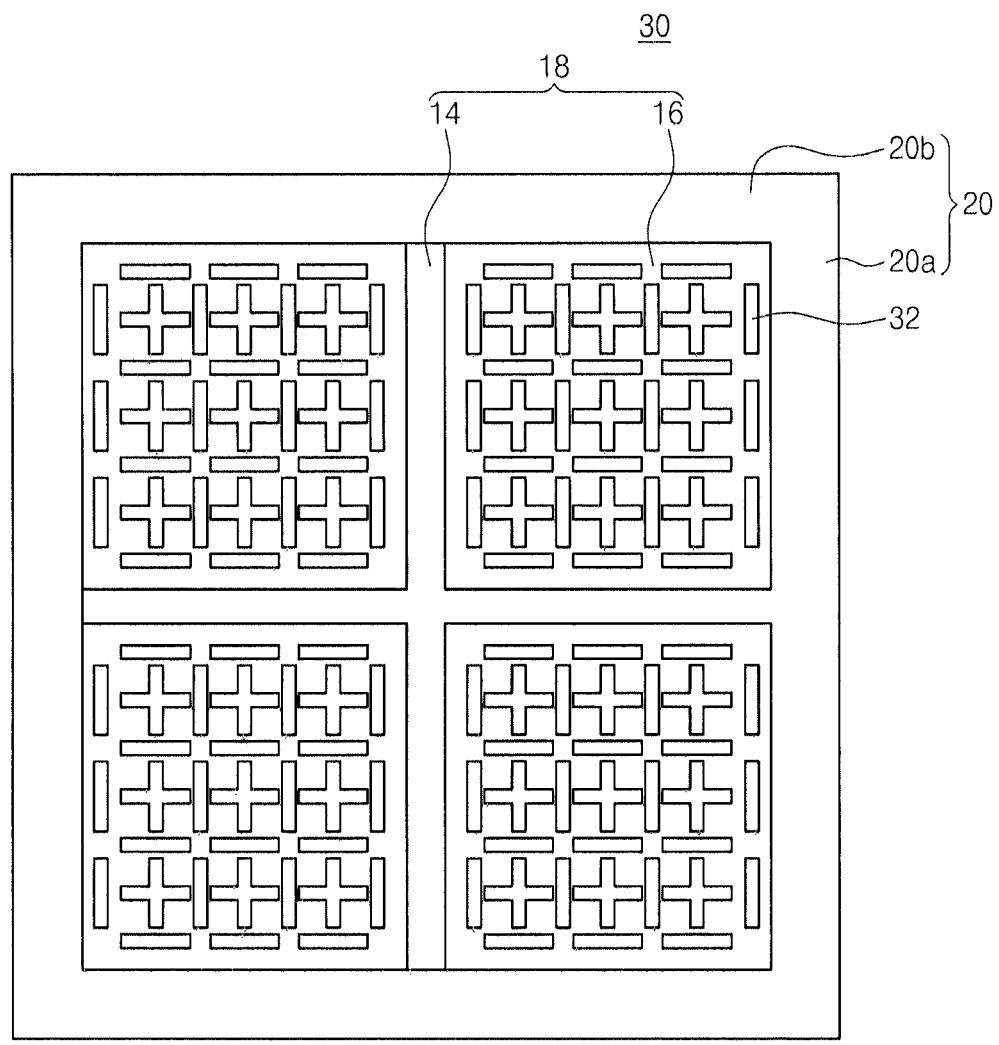
FIG. 4 is a plan view illustrating an example of a mask layout formed to have a pattern position error, when compared with the exposure layout of FIG. 3.

The data processing part 130 may be configured to generate one or more control parameters. One such control parameter can be a first control parameter, which can be used as part of an operation of the exposure part 110, from the pattern-layout-characterizing parameter. In example embodiments, the first control parameter may be associated with an acceleration of a stage preventing a pattern position error from occurring, FIG. 4 is a plan view illustrating an example of a mask layout 30 having a pattern position error, when compared with the exposure layout 10 of FIG. 3. In the case where there is the pattern position error, there is a discrepancy between the layout patterns 12 in the exposure layout 10 of FIG. 3 and mask patterns 32 in the mask layout 30. For example, the mask layout 30 may suffer from a pattern position error related to the mask patterns 32, which may occur near an interface between the main pattern region 18 and the scribe lane region 20 shown in FIG. 3, As shown in FIG. 4, near the interface between the first scribe lane region 20a and the main pattern region 18, the mask patterns 32 may be laterally shifted with respect to the layout patterns 12. For example, the mask patterns 32 may be moved toward the scribe lane region 20, along the scanning direction of the electron beam 104. The data processing part 130 may be configured to check whether pattern position error has occurred, based on information on positions of the mask patterns 32. In some embodiments, the pattern position error may result from an excessively large acceleration of the stage 118 shown in FIG. 1.

In the data processing part 130, data related to an acceleration of the stage 118 required for preventing the pattern position error may be derived from the pattern-layout-characterizing parameter. For example, the acceleration of the stage 118 may be defined as a difference in scanning speed of the electron beam 104 between the main pattern region 18 and the scribe lane region 20 for a given time interval. When the electron beam 104 passes through an interface between the main pattern region 18 and the scribe lane region 20, a movement of the stage 118 may be accelerated. For example, the scanning process using the electron beam 104 may be performed at constant speeds in both the main pattern region 18 and the scribe lane region 20. The scanning speed in the scribe lane region 20 may be higher than that in the main pattern region 18. A high acceleration of the stage 118 may lead to a difference in the scanning speed of the electron beam 104 between the main pattern region 18 and the scribe lane region 20. In certain embodiments, the acceleration of the stage 118 in a scanning direction of the electron beam 104 may be controlled by the first control parameter. The first control parameter may be proportional to the pattern-layout-characterizing parameter.

For example, a large difference between the first and second densities may translate to a high acceleration of the stage 118. The pattern-layout-characterizing parameter may be proportional to the acceleration of the stage 118. A proportional constant between the pattern-layout-characterizing parameter and the acceleration of the stage 118 may be given by the first control parameter, which may be stored in a first lookup table, which in turn may be stored in the database 140. The first lookup table may be prepared in an empirical manner. The controlling part 120 may control the acceleration of the stage 118 based on the first control parameter.

The data processing part 130 may be configured to derive a second control parameter, which will be used to operate the exposure part 110, from the pattern-layout-characterizing parameter. In example embodiments, the second control parameter may be associated with a deflection width of the electron beam 104 preventing a beam drift error from occurring.

Figure 5:
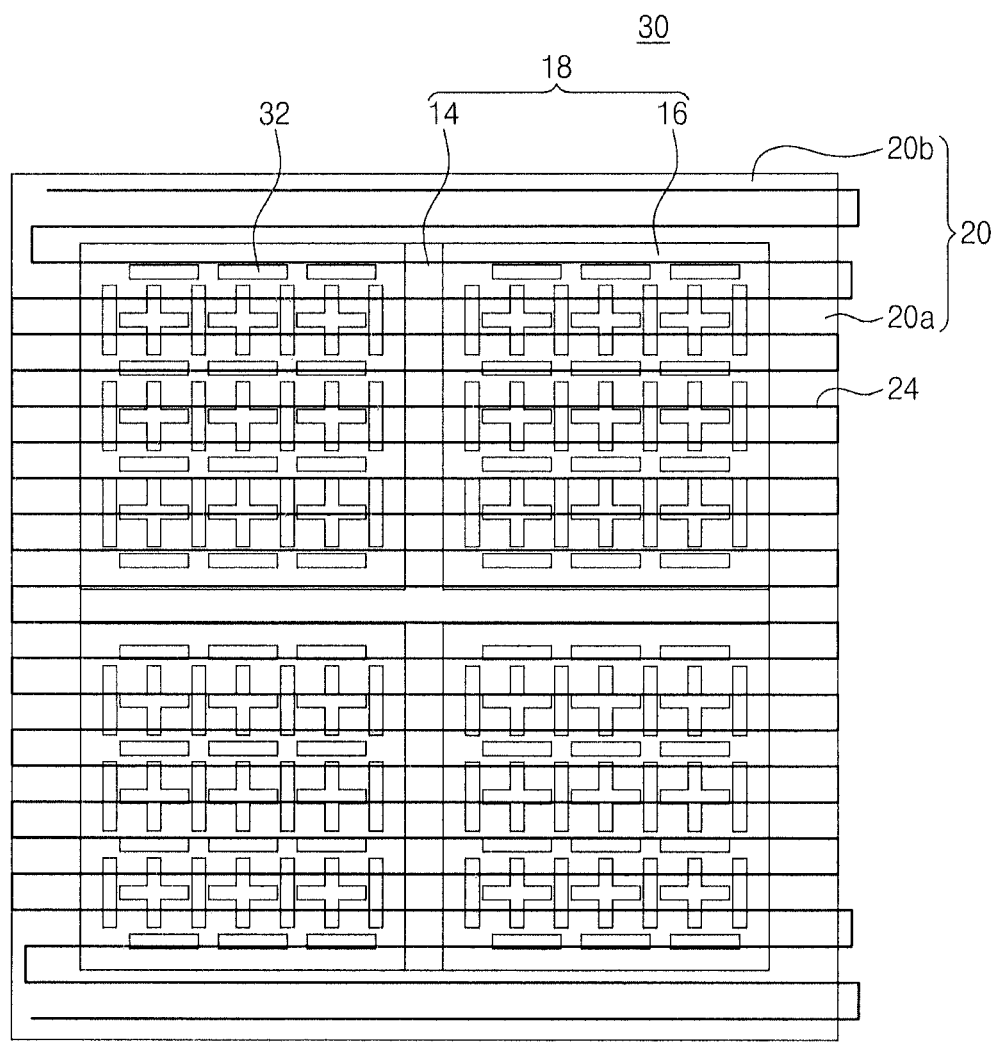
FIG. 5 is a plan view illustrating an example of a mask layout formed to have a beam drift error, when compared with the exposure layout of FIG. 3.

FIG. 5 is a plan view illustrating an example of the mask layout 30, which is formed to have a beam drift error as compared with the exposure layout 10 of FIG. 3. In the case where a beam drift error occurs, a scan line 24 may be displaced in a specific direction. A scanning process in accordance with embodiments using the electron beam 104 may be performed along the scan line 24. The beam drift error may occur when at least one deflector 116, for example, shown in FIG. 2, is contaminated by contaminant 105. In other words, a contamination caused by the deflectors 116 may lead to an abnormal deflection of the electron beam 104.

In doing so, the scan line 24 may be dislocated at the scribe lane region 20 and the main pattern region 18 adjacent thereto. The beam drift error may occur in the second scribe lane region 20b parallel to the scan line 24. Further, the beam drift error may occur in some of the mask patterns 32 positioned at an interface between the second scribe lane region 20b parallel to the scan line 24 and the main pattern region 18.

The beam drift error may be calculated from a contamination level of the deflectors 116. For example, the beam drift error may be parallel to the contamination level of the deflectors 116. The controlling part 120 may provide contamination information of the deflectors 116, which can be stored in the database 140, to the data processing part 130. The contamination information of the deflectors 116 may be provided from the database 140. The electron beam 104 may be deflected depending on the contamination level of the deflectors 116 or by the beam drift error. The data processing part 130 may be configured to derive a deflection width of the electron beam 104 preventing the beam drift error from occurring. Such a deflection width may be associated with the second control parameter. The second control parameter may be a variable for controlling the deflection width of the electron beam 104. For example, the second control parameter may be a variable for controlling the deflection width of the electron beam 104 near the second scribe lane region 20b parallel to the scanning direction of the electron beam 104 and a boundary region of the second scribe lane region 20b. The second control parameter may be proportional to the pattern-layout-characterizing parameter. The controlling part 120 may be configured to control the deflector 116 in such a way that the deflection width of the electron beam 104 is controlled according to the second control parameter. For example, an increase in difference between the first and second densities may lead to an increase in the deflection width of the electron beam 104. The pattern-layout-characterizing parameter may be proportional to the deflection width of the electron beam 104. Alternatively, an increase in difference between the first and second densities may lead to a reduction in the deflection width of the electron beam 104. In other words, the second control parameter may be inversely proportional to the pattern-layout-characterizing parameter. A correlation value of the deflection width of the electron beam 104 corresponding to the pattern-layout-characterizing parameter and the contamination level of the deflectors 116 may be given by the second control parameter, which may be stored in a second lookup table, which may be stored in the database 140. The second lookup table may be empirically prepared. Accordingly, the controlling part 120 may control the deflectors 116 in such a way that the deflection width of the electron beam 104 is controlled according to the second control parameter.

The exposure system according to example embodiments of the inventive concept may be used for a method of forming patterns, described below.

Figure 6:
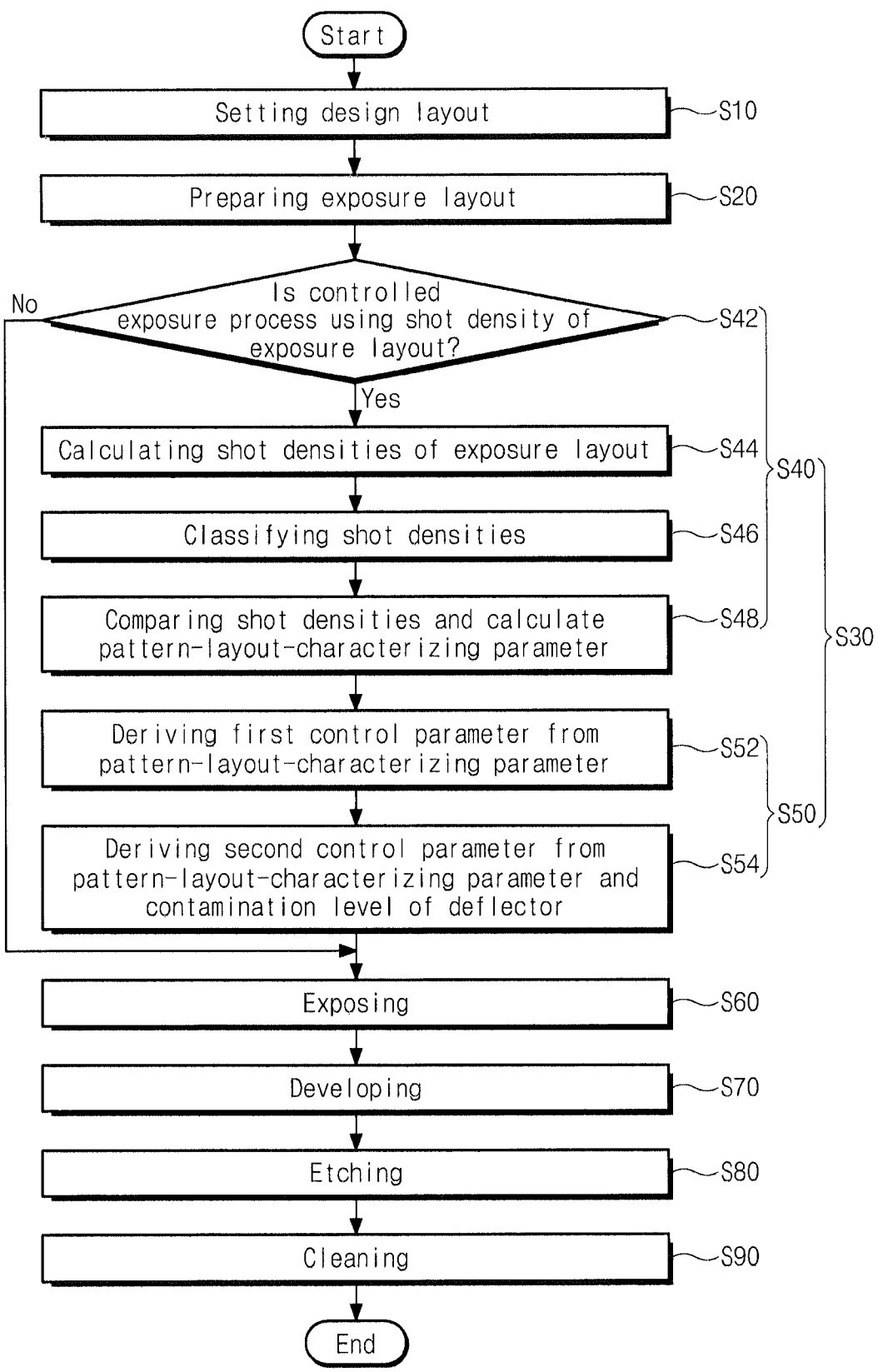
FIG. 6 is a flow chart illustrating an example of a patterning method according to example embodiments of the inventive concept.
Figure 7:
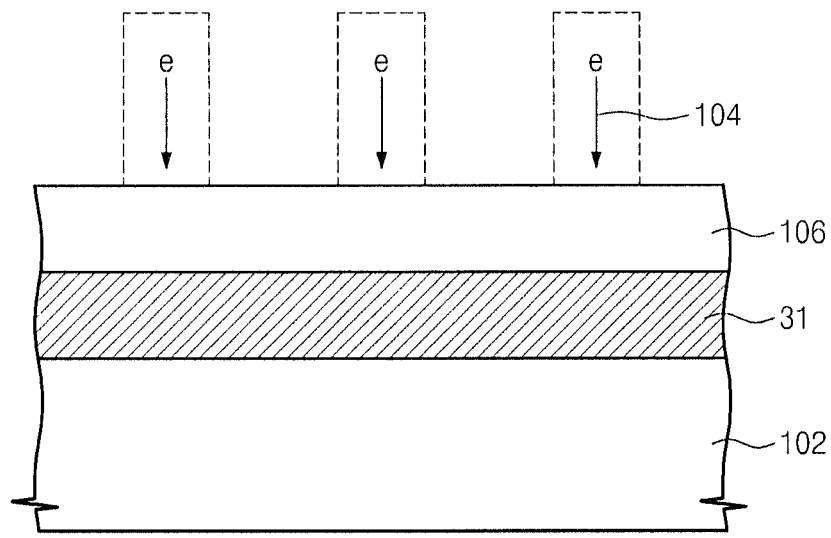
FIGS. 7 through 10 are sectional views exemplarily illustrating a process of forming mask patterns on a substrate of FIG. 1.
Figure 8:
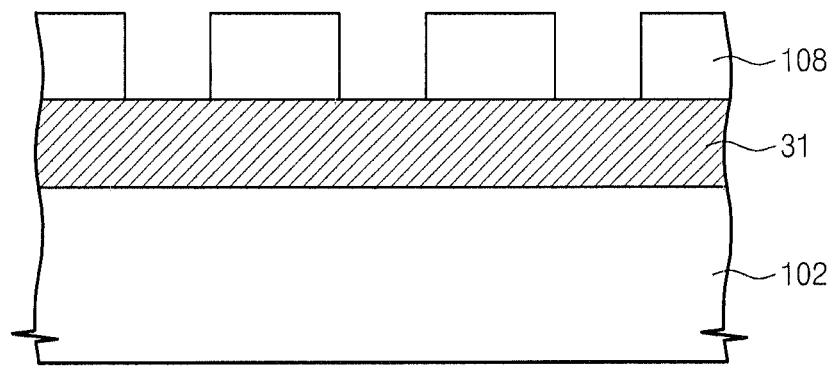
Figure 9:
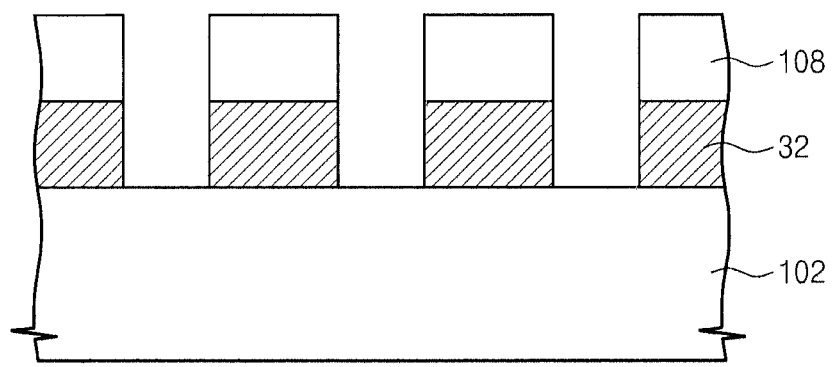
Figure 10:
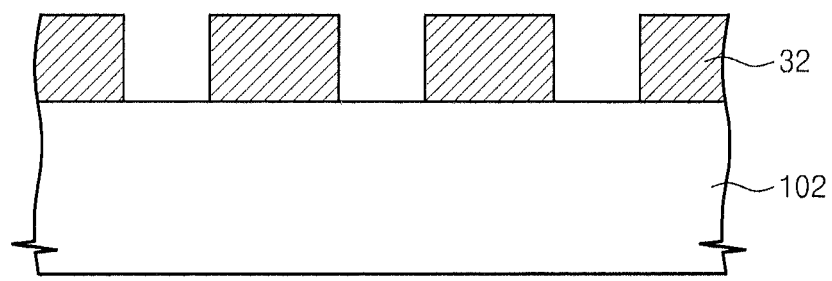

FIG. 6 is a flow chart illustrating an example of a patterning method according to example embodiments of the inventive concept.

First, a design layout may be set (in S10). The design layout may be a draft of the exposure layout 10. The design layout may be variously changed in consideration of user's requirements. The design layout may contain information on planar disposition or arrangement of patterns, which will be actually formed on the substrate 102. The design layout may contain data associated with shapes, sizes, and positions of basic figures. Here, the basic figures may be a quadrangle, triangle, or the like. The design layout may be provided from a server to the database 140 or the data processing part 130. For example, the data processing part 130 may receive information on first and second densities, which may be shot densities of the main pattern region 18 and the scribe lane region 20 described herein, respectively, from the server or the database 140. The first and second densities may be determined when the design layout is prepared. Alternatively, the first density and second densities may be determined (for example, by performing a calculation) after creating the exposure layout 10.

Next, the exposure layout 10 may be prepared according to the design layout (in S20). For example, the data processing part 130 may derive the exposure layout 10 suitable for the exposure system 100, based on empirical information on the design layout and the exposure system 100 transmitted from the database 140.

Control parameters for the exposure system 100 may be calculated (in S30), for example, to control the exposure part 110 of the exposure system 100. The control parameters may include the first and second control parameters. The first control parameter may be used to accelerate the stage 118 without a pattern position error. The second control parameter may be used to deflect the electron beam 104 without a beam drift error. The first and second control parameters may be derived from the pattern-layout-characterizing parameter. The pattern-layout-characterizing parameter may be calculated according to the shot densities of the exposure layout 10. In example embodiments, the calculation of the control parameter (S30) may include calculating the pattern-layout-characterizing parameter (in S40) and deriving the control parameter (in S50).

The calculation of the pattern-layout-characterizing parameter (S40) may include one or more of checking whether to use a shot density (in S42), calculating the shot densities (in S44), classifying the shot densities (in S46), and comparing the shot densities (in S48).

The step of checking whether to use the shot density (S42) may include determining whether or not to calculate the shot density of the exposure layout 10. For example, in the case where there is a difficulty in classifying the main pattern region 18 and the scribe lane region 20 in the exposure layout 10, the data processing part 130 may derive a second control parameter (in S50).

In the case where there is not difficulty in classifying the main pattern region 18 from the scribe lane region 20, shot densities for the entire region of the exposure layout 10 may be calculated by the data processing part 130 (in S44).

The step of classifying the shot densities (S46) may include classifying the exposure layout into the main pattern region 18 and the scribe line region 20 according to shot densities. The shot densities of the main pattern region 18 and the scribe line region 20 may be calculated as mean values. For example, the shot density of the main pattern region 18 may refer to a first density. The shot density of the scribe lane region 20 may refer to a second density. In the case where information related to the first and second densities is provided from the database 140 or the server, the steps (S44 and S46) for calculating and classifying the shot density and shot density may be omitted.

The step of comparing the shot densities (S48) may include comparing the shot density of the main pattern region 18 with that of the scribe line region 20, and calculating the pattern-layout-characterizing parameter, for example, described herein. The data processing part 130 may calculate a difference or a ratio between the first and second densities and calculate the pattern-layout-characterizing parameter based thereon.

The step of deriving the control parameter (S50) may include deriving the first and second control parameters from the pattern-layout-characterizing parameter. The step of deriving the control parameter (S50) may include deriving the first control parameter (in S52) and deriving the second control parameter (in S54).

The data processing part 130 may derive a first control parameter from the first lookup table, according to the pattern-layout-characterizing parameter (in S52). The first control parameter may be associated with the acceleration of the stage preventing pattern position error. In some embodiments, the first control parameter is correlated with the acceleration of the stage in a scanning direction of the electron beam.

The data processing part 130 may derive a second control parameter from the second lookup table, according to the pattern-layout-characterizing parameter and the contamination level of the deflectors 116 (in S54). The second control parameter may be associated with the deflection width of the electron beam 104 preventing beam drift error.

A process of forming mask patterns 32, for example, shown in FIG. 5, using the first and second control parameters is described in greater detail with reference to FIGS. 7 through 10.

FIGS. 7 through 10 are sectional views exemplarily illustrating a process of forming the mask patterns 32 on the substrate 102 of FIG. 1.

Referring to FIGS. 5 through 10, a photoresist layer 106 may be exposed by the electron beam 104, according to the exposure layout 10 (in S60). The electron beam 104 may be irradiated on the photoresist layer 106. The controlling part 120 may control the exposure part 110 according to the first and second control parameters. A chemical reaction may occur in portions of the photoresist layer 106 exposed by the electron beam 104. For example, when exposed by the electron beam 104, chemical chains in the photoresist layer 106 may be cut. The photoresist layer 106 may be formed on a mask layer 31 provided on the substrate 102. For example, the substrate 102 and the mask layer 31 may constitute a photomask. In some examples, the substrate 102 may include glass, and the mask layer 31 may include a chromium-containing layer. Alternatively, the substrate 102 and the mask layer 31 may constitute a product to be fabricated using a MEMS or semiconductor processing technology.

Next, the photoresist layer 106 may be developed to form one or more photoresist patterns 108 (in S70). A portion of the photoresist layer 106 may be removed and the other portion of the photoresist layer 106 may remain on the mask layer 31 and be used as the photoresist pattern 108.

Thereafter, the mask layer 31 may be etched using the photoresist patterns 108 as an etch mask. Thus, the mask patterns 32 may be formed on the substrate 102 (in S80). The etching process for forming the mask patterns 32 may be performed using a dry etching process or a wet etching process.

The structure provided with the mask patterns 32 may be cleaned to remove the photoresist patterns 108 (in S90). The removal of the photoresist patterns 108 may be performed using organic solvent, for example, ethanol, methanol, acetone, or the like.

Figure 11:
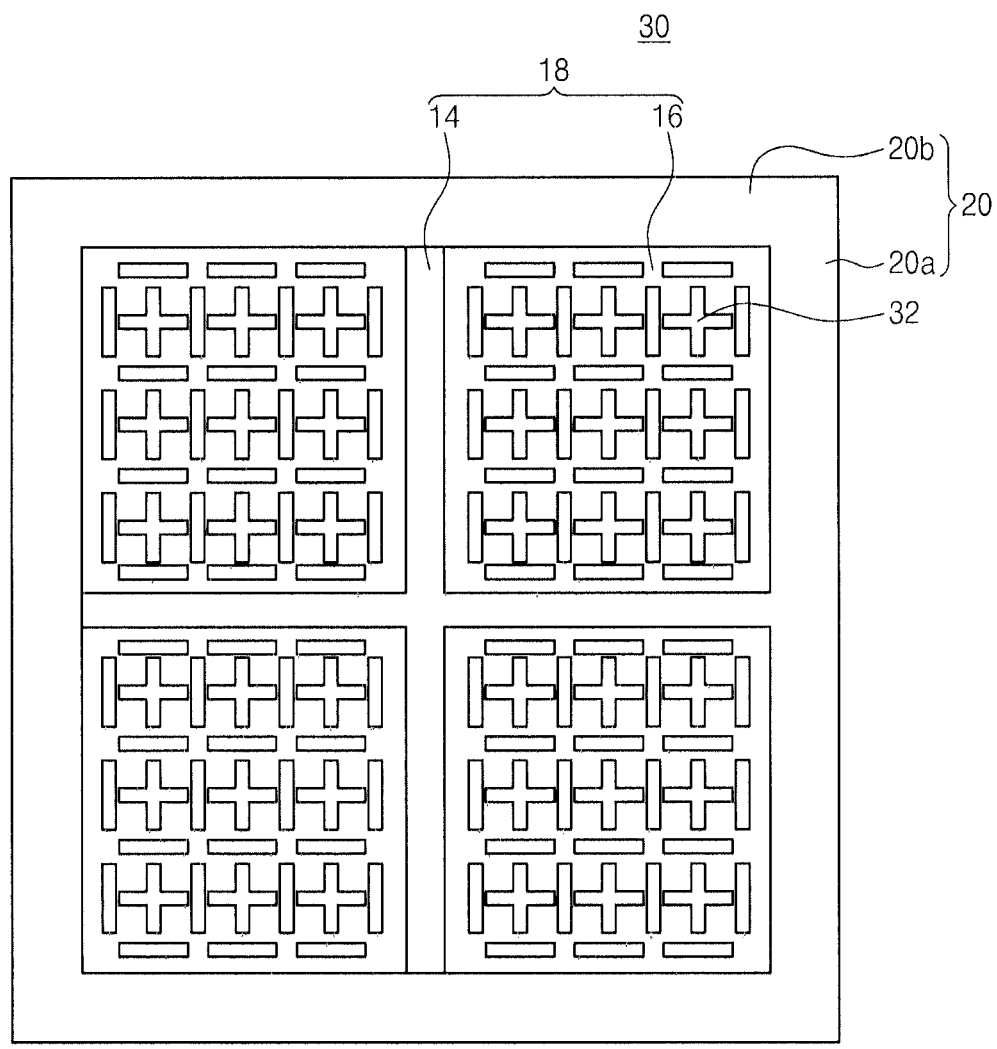
FIG. 11 is a plan view illustrating an example of a mask layout formed using the exposure layout of FIG. 3.

FIG. 11 is a plan view illustrating an example of a mask layout 30 formed using the exposure layout of FIG. 3. The mask layout 30 does not have any error related to pattern position and beam drift. The mask layout 30 may be formed to be similar to or substantially the same as the exposure layout 10. For example, positions of the main pattern region 18 and the scribe lane region 20 in the mask layout 30 may be similar to or substantially the same as those in the exposure layout 10. The mask patterns 32 may be formed precisely at positions given by the layout patterns 12. For example, near the interface between the main pattern region 18 and scribe line region 20, the mask patterns 32 may be formed to have similar or substantially the same shapes as those defined by the layout patterns 12.

According to example embodiments of the inventive concept, an exposure system is configured to control an acceleration of a stage in consideration of shot densities to be applied for a main pattern region and a scribe lane region, respectively, in an exposure layout, for preventing a pattern position error. Further, the exposure system is configured to control a deflection width of an electron beam, with consideration made to the shot densities and a contamination level of a deflector, therefore preventing a beam drift error.

While example embodiments of the inventive concepts have been particularly shown and described, it will be understood by one of ordinary skill in the art that variations in form and detail may be made therein without departing from the spirit and scope of the attached claims.

What is claimed is:

1. An exposure system, comprising:
   a data processing part of a processing unit that forms an exposure layout from a design layout stored at a data storage device and retrieved from the data storage device by the data processing unit; and
   an exposure part that irradiates an electron beam at a photoresist layer according to the exposure layout, wherein the data processing part of the processing unit is constructed and arranged to generate a control parameter of the exposure part obtained from the exposure layout for driving the exposure part without a pattern position error and a beam drift error and to prevent a discrepancy between the exposure layout and a mask layout to be formed in the photoresist layer;
   wherein the exposure part is controlled by a controlling part of the processing unit according to the control parameter;
   wherein the data processing part of the processing unit calculates a shot density of the exposure layout, the shot density used to prevent the pattern position error and the beam drift error;
   wherein the data processing part of the processing unit calculates the control parameter from the shot density; and
   wherein the shot density includes an area occupied by the layout patterns per a unit area of the exposure layout.

2. The exposure system of claim 1, wherein the data processing part of the processing unit calculates a characterizing parameter from the shot density and derives the control parameter from the characterizing parameter.

3. The exposure system of claim 2, wherein the shot density comprises:
   a first density for a dense region in the exposure layout; and
   a second density for a sparse region other than the dense region,
   wherein the data processing part of the processing unit calculates the characterizing parameter from a difference or ratio between the first and second densities.

4. The exposure system of claim 3, wherein the exposure part comprises:
   a beam source that generates the electron beam;
   a deflector that deflects the electron beam in a tilted direction relative to the mask layer; and
   a stage that supports the substrate and moves the substrate relative to the electron beam, wherein the control parameter comprises:
   a first control parameter associated with an acceleration of the stage; and
   a second control parameter associated with a deflection width of the electron beam in the deflector.

5. The exposure system of claim 4, wherein the stage is accelerated at an interface between the dense and sparse regions of the exposure layout such that a velocity of the stage is lower at the dense region than at the sparse region, and wherein the first control parameter is correlated with the acceleration of the stage in a scanning direction of the electron beam.

6. The exposure system of claim 5, wherein the second control parameter is correlated with the deflection width of the electron beam in the dense and sparse regions adjacent to each other in a direction perpendicular to the scanning direction of the electron beam.

7. The exposure system of claim 5, wherein the exposure layout comprises:
a main pattern region at the dense region; and
a scribe lane region at the sparse region to surround the main pattern region,
wherein the scribe lane region comprises:
a first scribe lane region parallel to the scanning direction of the electron beam and adjacent to the main pattern region; and
a second scribe lane region perpendicular to the scanning direction of the electron beam,
wherein the controlling part of the processing unit controls the exposure part using the first control parameter to prevent the pattern position error near an interface between the first scribe lane region and the main pattern region and controls the exposure part using the second control parameter to prevent the beam drift error near an interface between the second scribe lane region and the main pattern region.

8. The exposure system of claim 4, wherein shot density includes an area occupied by the layout patterns per a unit area of the exposure layout, from a characterizing parameter, and wherein the data processing part of the processing unit further derives the first control parameter from a proportional constant between the characterizing parameter and the acceleration of the stage, and derives the second control parameter from a correlation value between the characterizing parameter, a contamination level of the deflector, and the deflection width of the electron beam.

9. The exposure system of claim 8, further comprising a database including a lookup table, wherein the proportional constant and the correlation value are stored at the lookup table.

10. An exposing method, comprising:
preparing an exposure layout:
generating a control parameter of an exposure part obtained from the exposure layout; and
exposing a photoresist layer with an electron beam emitted from the exposure part to form mask patterns based on the exposure layout,
wherein the control parameter is generated for driving the exposure part with at least a minimal pattern position error and a beam drift error and to prevent a discrepancy between the exposure layout and a mask layout to be formed in the photoresist layer.

11. The method of claim 10, wherein generating the control parameter comprises:
calculating a characterizing parameter from a shot density, wherein the shot density includes an area occupied by layout patterns per a unit area of the exposure layout; and
deriving the control parameter from the characterizing parameter.

12. The method of claim 11, wherein the calculating of the characterizing parameter comprises:
calculating the shot density of the exposure layout; and
calculating the characterizing parameter from the shot density.

13. The method of claim 12, wherein the calculating of the characterizing parameter comprises:
obtaining shot densities in dense and sparse regions, respectively, which include two distinct regions of the exposure layout; and
comparing the shot densities in the dense and sparse regions to calculate the characterizing parameter.

14. The method of claim 13, wherein the shot density comprises:
a first density for the dense region; and
a second density for the sparse region,
wherein the characterizing parameter is calculated from a difference or ratio between the first and second densities.

15. An exposure system, comprising:
a data processing part of a processing unit that forms an exposure layout from a design layout stored at a data storage device and retrieved from the data storage device by the data processing unit and generates a control parameter of an exposure part obtained from the exposure layout; and
the exposure part that irradiates an electron beam at a photoresist layer according to the exposure layout;
wherein the exposure part is controlled by a controlling part of the processing unit according to the control parameter;
wherein the data processing part of the processing unit generates the control parameter for driving the exposure part without a pattern position error and a beam drift error and prevent a discrepancy between the exposure layout and a mask layout to be formed in the photoresist layer; and
wherein the data processing part of the processing unit derives the control parameter from a shot density, calculates a characterizing parameter from the shot density, and derives the control parameter from the characterizing parameter.

16. The exposure system of claim 15, wherein the characterizing parameter is calculated by obtaining shot densities in dense and sparse regions, respectively, which include two distinct regions of the exposure layout; and comparing the shot densities in the dense and sparse regions to calculate the characterizing parameter.

17. The exposure system of claim 15, wherein the exposure part comprises:
a beam source that generates the electron beam;
a deflector that deflects the electron beam in a tilted direction relative to the mask layer; and
a stage that supports the substrate and moves the substrate relative to the electron beam, wherein the control parameter comprises:
a first control parameter associated with an acceleration of the stage; and
a second control parameter associated with a deflection width of the electron beam in the deflector.

* * * * *